United States Patent [19]
Sakao et al.

[11] Patent Number: 5,548,157
[45] Date of Patent: Aug. 20, 1996

[54] SEMICONDUCTOR DEVICE CAPABLE OF INCREASING RELIABILITY

[75] Inventors: Masato Sakao; Shuichi Ohya, both of Tokyo, Japan

[73] Assignee: NEC Corporation, Tokyo, Japan

[21] Appl. No.: 441,573

[22] Filed: May 15, 1995

Related U.S. Application Data

[63] Continuation of Ser. No. 116,569, Sep. 7, 1993, Pat. No. 5,466,964.

[30] Foreign Application Priority Data

Sep. 7, 1992 [JP] Japan .................... 4-237948

[51] Int. Cl.$^6$ .................................. H01L 29/78
[52] U.S. Cl. ........................... 257/532; 257/310
[58] Field of Search .................... 257/306, 310, 257/311, 308, 309, 532, 534, 535; 361/313

[56] References Cited

U.S. PATENT DOCUMENTS 5,276,343  1/1994  Kumagai et al. ................ 257/306

FOREIGN PATENT DOCUMENTS

| 0415751 | 3/1991 | European Pat. Off. | ............ 257/532 |
| 3257857 | 11/1991 | Japan | .................. 257/532 |
| 4101453 | 4/1992 | Japan | .................. 257/532 |

OTHER PUBLICATIONS

"A Stacked Capacitor with $(Ba_xSr_{1-x})TiO_3$ for 256 M DRAM", by Kuniaki Koyama et al., VLSI Development IEDM Technical Digest 1991, pp. 823–826.

*Primary Examiner*—Donald L. Monin, Jr.
*Attorney, Agent, or Firm*—Sughrue, Mion, Zinn, Macpeak & Seas

[57] ABSTRACT

In a semiconductor device having a first insulator layer on a semiconductor substrate and accumulation electrode layers overlying the first insulator layer, second insulator layers overlie predetermined areas of the first insulator layer and side electrode surfaces of the accumulation electrode layers. Each of the second insulator layers has a primary dielectric constant. A dielectric layer overlies upper surfaces of the accumulation electrode layers and the second insulator layers and has a secondary dielectric constant which is higher than the primary dielectric constant. An opposed electrode layer overlies the dielectric layer.

1 Claim, 3 Drawing Sheets

(a)

(b)

(c)

SEMICONDUCTOR DEVICE CAPABLE OF INCREASING RELIABILITY

This is a continuation of application Ser. No. 08/116,569 filed Sep. 7, 1993, now U.S. Pat. No. 5,466,964.

BACKGROUND OF THE INVENTION

This invention relates to a semiconductor device having a plurality of accumulation electrode layers, an opposed electrode layer, and a dielectric layer interposed between the accumulation electrodes and the opposed electrode layer.

In the manner which will later be described more in detail, a conventional semiconductor device is disclosed in "IEDM Technical Digest 1991, pp. 823–826". This conventional semiconductor device comprises a semiconductor substrate, a first insulator layer on the semiconductor substrate, a plurality of accumulation electrode layers on the first insulator layer, a dielectric layer on the accumulation electrodes and the first insulator layer, and an opposed electrode layer on the dielectric layer.

Inasmuch as the dielectric layer is interposed between two adjacent ones of the accumulation electrode layers, a coupling capacitance value between two adjacent ones of the accumulation electrode layers is large. Consequently, it is assumed that a voltage of one of the accumulation electrode layers changes, voltages of two ones adjacent to the one of the accumulation electrode layers are changed by the voltage of the one of the accumulation electrode layers. As a result, this conventional semiconductor device has a low reliability.

SUMMARY OF THE INVENTION

It is therefore an object of the present invention to provide a semiconductor device which is capable of increasing reliability.

Other objects of this invention will become clear as the description proceeds.

According to an aspect of this invention, there is provided a semiconductor device which comprises (A) a semiconductor substrate having a principal surfaces (B) a first insulator layer overlying the principal surface and having a first upper insulator surface: (C) a plurality of accumulation electrode layers overlying the first upper insulator surface where spaces are formed between adjacent ones of the accumulation electrode layers, the spaces exposing par surfaces of the first upper insulator surface, the accumulation electrode layers having upper electrode surfaces and side electrode surfaces; (D) a plurality of second insulator layers overlying the part surfaces and being in contact with the side electrode surfaces the second insulator layers having second upper insulator surfaces, each of the second insulator layers having a primary dielectric constant; (E) a dielectric layer overlying the upper electrode surfaces and the second upper insulator surfaces and having an upper dielectric surface and a secondary dielectric constant which is higher than the primary dielectric constant; and (F) an opposed electrode layer overlying the upper dielectric surface.

According to another aspect of this invention, there is provided a semiconductor device which comprises (A) a semiconductor substrate having a principal surface; (B) a first insulator layer overlying the principal surface and having a first upper insulator surface; (C) a plurality of accumulation electrode layers overlying the first upper insulator surface where spaces are formed between adjacent ones of the accumulation electrode layers, the spaces exposing part surfaces of the first upper insulator surface, the accumulation electrode layers having upper electrode surfaces and side electrode surfaces; (D) a plurality of dielectric layers overlying the upper electrode surfaces and having upper dielectric surfaces and side dielectric surfaces, each of the dielectric layers having a first dielectric constant; (E) a plurality of second insulator layers overlying the side electrode surfaces, and the side dielectric surfaces, the second insulator layer having second upper insulator surfaces, each of the second insulator layers having a second dielectric constant which is lower than the first dielectric constant; and (F) an opposed electrode layer overlying the upper dielectric surfaces and the second upper insulator surfaces.

Figure 1:
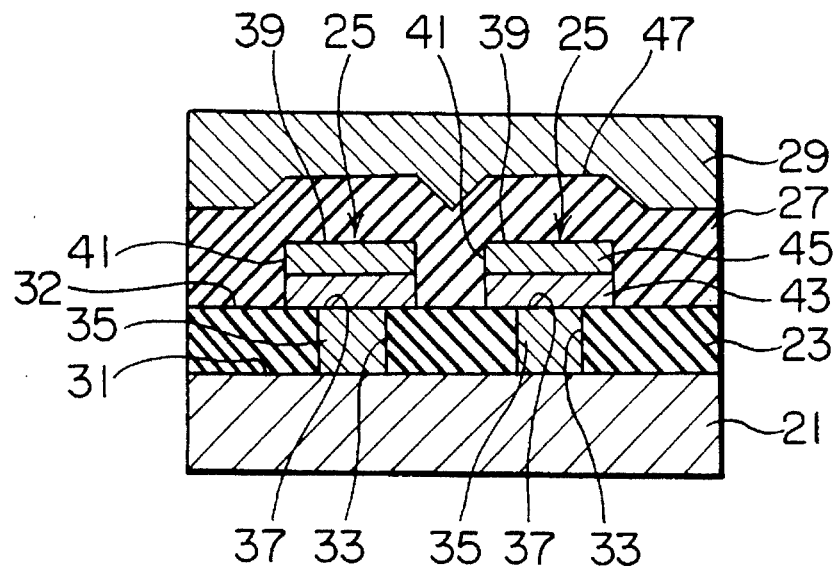
FIG. 1 is a schematic vertical sectional view of a conventional semiconductor device.

DESCRIPTION OF THE PREFERRED EMBODIMENTS:

Referring to FIG. 1, a conventional semiconductor device will be described for a better understanding of this invention.

In FIG. 1, the conventional semiconductor device comprises a semiconductor substrate 21, a first insulator layer 23, a plurality of accumulation electrode layers 25, a dielectric layer 27, and an opposed electrode layer 29.

The semiconductor substrate 21 has a principal surface 31. The first insulator layer 23 overlies the principal surface 31 and has a first upper insulator surface 32. The first insulator layer 23 has recessed surfaces 33 which define contact holes exposing predetermined areas of the principal surface 31. A plurality of conductor layers 35 overlie the predetermined areas of the principal surface 31 and are in contact with the recessed surfaces 33. Namely, the conductor layer 35 are interposed in the contact holes. The conductor layers 35 have upper conductor surfaces 37.

The accumulation electrode layers 25 overlie the upper conductor surfaces 37 and the first upper insulator surface 32 where spaces are formed between adjacent ones of the accumulation electrode layers 25. The spaces expose part surfaces of the first upper insulator surface 32. The accumulation electrode layers 25 have upper electrode surfaces 39 and side electrode surfaces 41. Each of the accumulation electrode layers 25 comprises a primary electrode layer 43 and a secondary electrode layer 45. The primary electrode layer 43 overlies the upper conductor surface 37 and the first upper insulator surface 32. The secondary electrode layer 45 overlies the primary electrode layer 43.

The dielectric layer 27 overlies the upper electrode surfaces 39, and the part surfaces of the first upper insulator surface 32. The dielectric layer 27 is in contact with the side electrode surfaces 41. The dielectric layer 27 has an upper dielectric surface 47. The opposed electrode layer 29 overlies the upper dielectric surface 47.

The semiconductor substrate 21 was made of silicon. The first insulator layer 23 was made of silicon oxide. The conductor layer 35 was made of polycrystal silicon. The primary electrode layer 43 was made of Ta. The secondary electrode layer 45 was made of Pt. The dielectric layer 27 was made of $Ba_{0.5}Sr_{0.5}TiO_3$. The opposed electrode layer 29 was made of titanium nitride.

Inasmuch as the dielectric layer 27 is interposed between two adjacent ones of the accumulation electrode layers 25, a coupling capacitance value between two adjacent ones of the accumulation electrode layers 25 is large. For example, the coupling capacitance value between two adjacent ones of the accumulation electrode layers 25 is $2.8 \times 10^{-15}$ farad. Consequently, it is assumed that a voltage of one of the accumulation electrode layers 25 changes, voltages of two adjacent ones to the one of the accumulation electrode layers 25 are changed by the voltage of the one of the accumulation electrode layers 25. As a result, this conventional semiconductor device has a low reliability.

Figure 2:
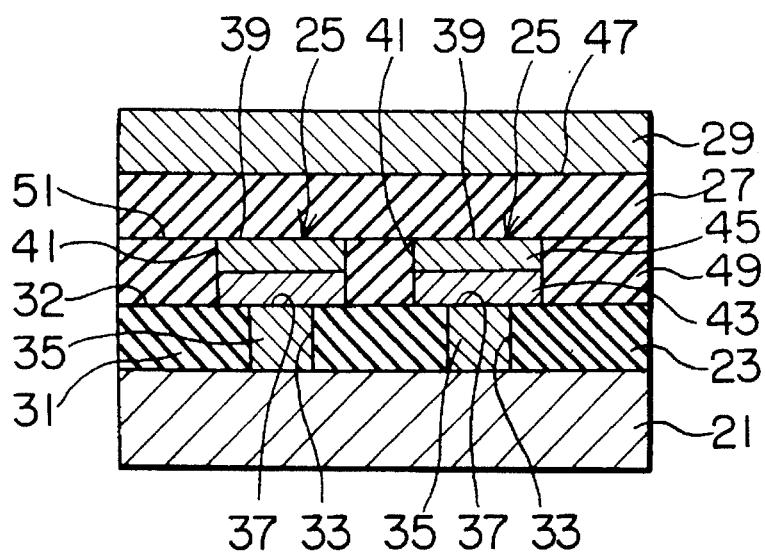
FIG. 2 is a schematic vertical sectional view of a semiconductor device according to a first embodiment of this invention.

Referring to FIG. 2, the description will proceed to a semiconductor device according to a first embodiment of this invention. Similar parts are designated by like reference numerals.

In FIG. 2, plurality of second insulator layers 49 overlie the part surfaces of the first upper insulator surface 32. Each of the second insulator layers 49 has second upper insulator surface 51. The second insulator layer 49 was made of silicon oxide and has a primary dielectric constant.

The dielectric layer 27 overlies the upper electrode surfaces 39 and the second upper surface 51. The dielectric layer 27 has a secondary dielectric constant which is higher than the primary dielectric constant. The primary dielectric constant is from 3 to 30. The secondary dielectric constant is from 200 to 2,000.

Referring to FIGS. 3(a) to (e), the description will proceed to a method of manufacturing the semiconductor device to the first embodiment of this invention. Similar parts are designated by like reference numerals.

Figure 3:
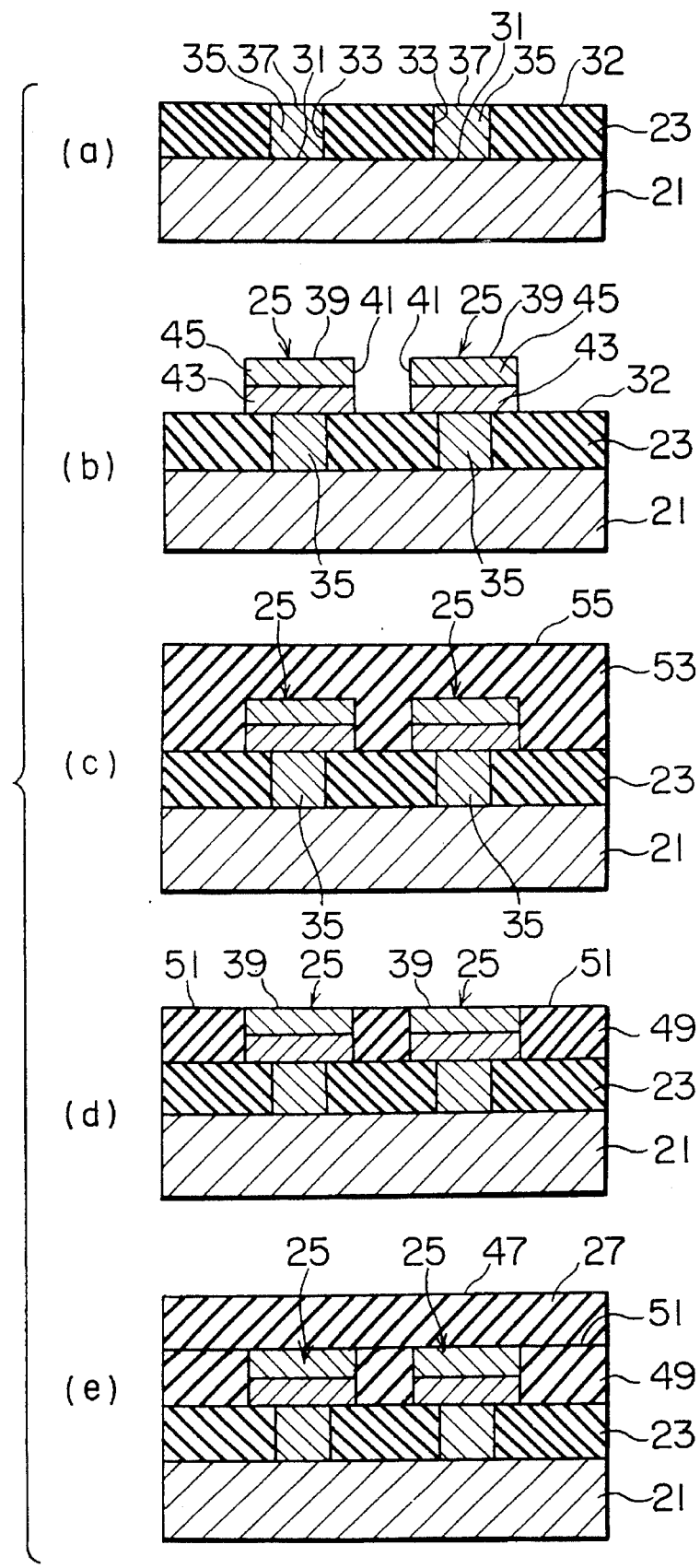
FIGS. 3(a) to (e) are schematic vertical sectional views for explaining a method of manufacturing the semiconductor device according to the first embodiment of this invention.

In FIG. 3(a), the semiconductor substrate 21 was prepared in the known manner to have the principal surface 31. The semiconductor substrate 21 was made of silicon. The first insulator layer 23 was formed on the semiconductor substrate 21 by heating and oxidizing the principal surface 31 of the semiconductor substrate 21 to have the first insulator surface 32.

The first insulator layer 23 was formed by using a photo-lithography method and a dry etching method to have the recessed surfaces 33 which define the contact holes exposing the predetermined areas of the principal surface 31. The conductor layers 35 were formed in the contact holes by using a chemical vapor deposition method, a thermal diffusion method, and the dry etching method to have the upper conductor surfaces 37.

In FIG. 3(b), the accumulation electrode layers 5 were formed on the upper conductor surfaces 37 and the first upper insulator surface 32 where spaces are formed between two adjacent ones of the accumulation electrode layers 25 by using a sputter method, the photo-lithography method, and the dry etching method to form the upper electrode surfaces 39 and the side electrode surfaces 41.

In FIG. 3(c), a precedent second insulator layer 53 was formed on the part surfaces of the first upper insulator surface 32, and the upper electrode surface 39 by using the chemical vapor deposition method to be in contact with the side electrode surface 41 and have an insulator plane surface 55.

In FIG. 3(d), the second insulator layer 49 was formed by etching the precedent second insulator layer 53 to have the second upper insulator surfaces 51.

In FIG. 3(e), the dielectric layer 27 was formed on the upper electrode surfaces 39 and the second upper insulator surface 51 by using a high frequency magnetron sputter method to have the upper dielectric surface 47. The opposed electrode layer 29 was formed on the upper dielectric surface 47 by using the sputter method (FIG. 2).

Figure 4:
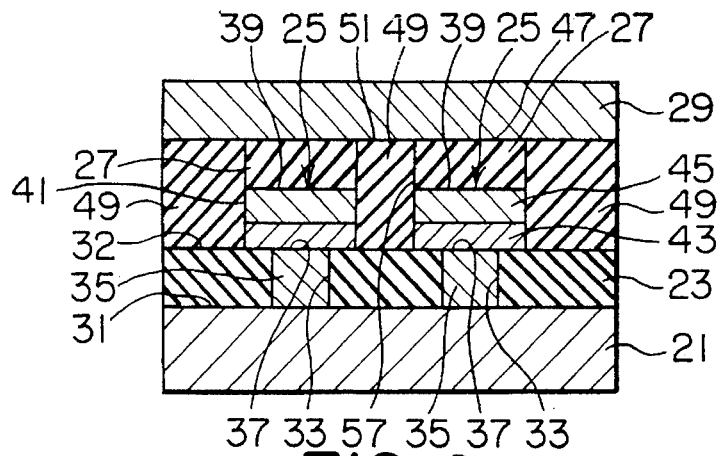
FIG. 4 is a schematic vertical sectional view of a semiconductor device according to a second embodiment of this invention.

Referring to FIG. 4, the description will proceed to a semiconductor device according to a second embodiment of this invention. Similar parts are designated by like reference numerals.

In FIG. 4, a plurality of dielectric layers 27 overlie the upper electrode surfaces 39. The dielectric layers 27 have upper dielectric surfaces 47 and side dielectric surfaces 57. A plurality of second insulator layers 49 overlie the part surfaces of the first upper insulator surface 32, and is in connection with the side electrode surfaces 41 and the side dielectric surfaces 57. The second insulator layers 49 have second upper insulator surfaces 51. The opposed electrode layer 29 overlies the upper dielectric surface 47 and the second upper insulator surfaces 51.

Figure 5:
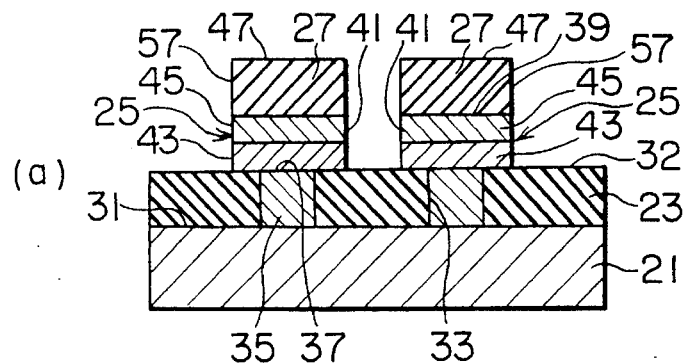
FIGS. 5(a) to (c) are schematic vertical sectional views for explaining a method of manufacturing the semiconductor device according to the second embodiment of this invention.
Figure 5:
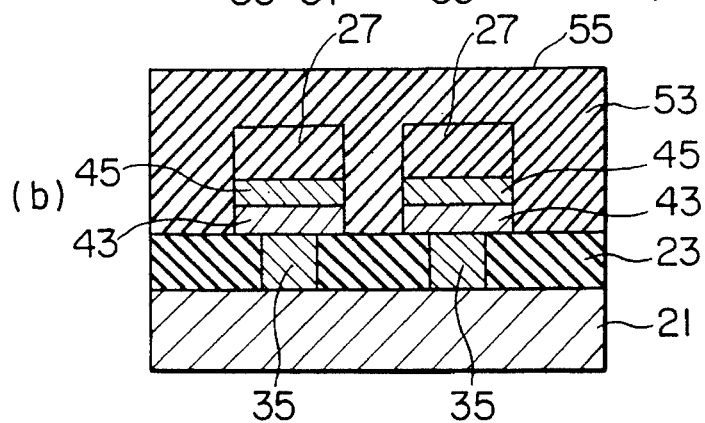
Figure 5:
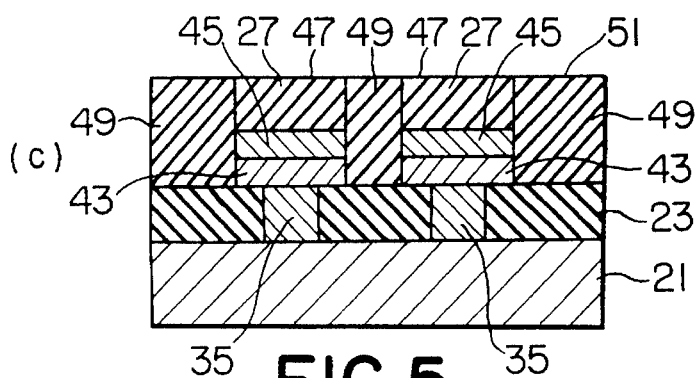

Referring to FIGS. 5(a) to (c), the description will proceed to method of manufacturing the semiconductor device according to the second embodiment of this invention. Similar parts are designated by like reference numerals.

In FIG. 5(a), the semiconductor substrate 21 was prepared in the known manner to have the principal surface 31. The semiconductor substrate 21 was made of silicon. The first insulator layer 23 was formed on the semiconductor substrate 21 by heating and oxidizing the principal surface 31 of the semiconductor substrate 21 to have the first insulator surface 32.

The first insulator layer 23 was formed by using the photo-lithography method and the dry etching method to have the recessed surfaces 33 which define the contact holes exposing the predetermined areas of the principal surface 31. The conductor layers 35 were formed in the contact holes by using the chemical vapor deposition method, the thermal diffusion method, and the dry etching method to have the upper conductor surfaces 37.

The accumulation electrode layers 25 were formed on the upper conductor surfaces and the first upper insulator surface 32 where spaces are formed between adjacent ones of the accumulation electrode layers 25 by using the sputter method, the photo-lithography method, the dry etching method to have the upper electrode surfaces 39 and the side electrode surfaces 41.

The dielectric layers 27 were formed on the upper electrode surfaces 39 by using the high frequency magnetron sputter method to have the upper dielectric surfaces 47 and the side dielectric surfaces 57.

In FIG. 5(b), the precedent second insulator layer 53 was formed on the part surfaces of the first upper insulator surface 32, and the upper dielectric surfaces 47 by using the chemical vapor deposition method to have the insulator plane surface 55 and be in contract with the side electrode surfaces 41 and the side dielectric surfaces 57.

In FIG. 5(c), the second insulator layers 49 were formed by etching the precedent second insulator layer 53 to have the second upper insulator surfaces 51. The opposed electrode layer 29 was formed on the upper dielectric surfaces 51 and the second upper insulator surfaces 47 by using the sputter method (FIG. 4).

In FIG. 2, the first insulator layer 23 has a thickness of 1,000 to 2,000 angstroms. Each of the primary electrode layers 43 has a thickness of 100 to 2,000 angstroms. Each of the secondary electrode layers 45 has a thickness of 100 to 2,000 angstroms. Each of the second insulator layers 49 has a thickness of 200 to 4,000 angstroms. The dielectric layer 27 has a thickness of 100 to 2,000 angstroms. The opposed electrode layer 29 has a thickness of 500 to 4,000 angstroms. A distance between two adjacent ones of the accumulation electrode layers 25 is 0.1 to 0.4 micron.

Inasmuch as the second insulator 49 is interposed between two adjacent ones of the accumulation electrode layers 25, a coupling capacitance value between two adjacent ones of the accumulation electrode layers is $1.3 \times 10^{-17}$ farad.

In FIG. 4, a coupling capacitance value between two adjacent ones of the accumulation electrode layers 25 is $4.4=10^{-18}$ farad.

What is claimed is:

1. A semiconductor device comprising:

a semiconductor substrate having a principal surface;

a first insulator layer overlying said principal surface and having a first upper insulator surface;

a plurality of accumulation electrode layers overlying said first upper insulator surface with spaces being formed between adjacent ones of said accumulation electrode layers, said spaces exposing part surfaces of said first upper insulator surface, said accumulation electrode layers having upper electrode surfaces and side electrode surfaces;

a plurality of second insulator layers overlying said part surfaces and being in contact with said side electrode surfaces, said second insulator layers having second upper insulator surfaces, each of said second insulator layers having a primary dielectric constant;

a dielectric layer formed on and being in contact with said upper electrode surfaces and said second upper insulator surfaces and having an upper dielectric surface and a secondary dielectric constant which is higher than said primary dielectric constant; and an opposed electrode layer overlying said upper dielectric surface.

* * * * *

UNITED STATES PATENT AND TRADEMARK OFFICE
CERTIFICATE OF CORRECTION

PATENT NO. : 5,548,157
DATED : August 20, 1996
INVENTOR(S) : Masato SAKAO, et al.

It is certified that error appears in the above-indentified patent and that said Letters Patent is hereby corrected as shown below:

Column 1, line 46, delete "par" and insert --part--.

Column 4, line 49, after "surfaces" insert --39--.

Column 5, line 21, delete "=" and insert --x--.

Signed and Sealed this

Twenty-sixth Day of November 1996

Attest:

BRUCE LEHMAN

Attesting Officer      Commissioner of Patents and Trademarks